United States Patent
Fujisawa et al.

(10) Patent No.: US 8,852,754 B2
(45) Date of Patent: Oct. 7, 2014

(54) SURFACE-TREATED COPPER FOIL, METHOD FOR PRODUCING SAME, AND COPPER CLAD LAMINATED BOARD

(75) Inventors: Satoshi Fujisawa, Tokyo (JP); Takeo Uno, Tokyo (JP); Koichi Hattori, Chiba (JP)

(73) Assignee: Furukawa Electric Co., Ltd., Tokyo (JP)

(*) Notice: Subject to any disclaimer, the term of this patent is extended or adjusted under 35 U.S.C. 154(b) by 3 days.

(21) Appl. No.: 13/574,478

(22) PCT Filed: Jan. 21, 2011

(86) PCT No.: PCT/JP2011/051131
§ 371 (c)(1),
(2), (4) Date: Sep. 17, 2012

(87) PCT Pub. No.: WO2011/090174
PCT Pub. Date: Jul. 28, 2011

(65) Prior Publication Data
US 2013/0040162 A1 Feb. 14, 2013

(30) Foreign Application Priority Data
Jan. 22, 2010 (JP) .................. 2010-012244

(51) Int. Cl.
| | |
|---|---|
| B32B 15/20 | (2006.01) |
| C25D 3/56 | (2006.01) |
| C22C 19/00 | (2006.01) |
| B32B 15/01 | (2006.01) |
| C25D 5/48 | (2006.01) |
| B32B 15/08 | (2006.01) |
| C22C 19/03 | (2006.01) |
| C25D 5/34 | (2006.01) |
| H05K 3/38 | (2006.01) |

(52) U.S. Cl.
CPC ...... *C25D 5/34* (2013.01); *C25D 3/562* (2013.01); *C22C 19/002* (2013.01); *B32B 15/01* (2013.01); *C25D 5/48* (2013.01); *B32B 15/08* (2013.01); *B32B 2457/00* (2013.01); *H05K 2201/0154* (2013.01); *C22C 19/03* (2013.01); *H05K 3/384* (2013.01)
USPC ........... 428/671; 428/609; 428/612; 428/621; 428/624; 428/658; 428/607; 428/675

(58) Field of Classification Search
USPC ........... 428/607, 62, 626, 658, 675, 687, 609, 428/612, 621, 624, 671
See application file for complete search history.

(56) References Cited

U.S. PATENT DOCUMENTS

| | | | | |
|---|---|---|---|---|
| 4,970,107 A | * | 11/1990 | Akahoshi et al. | 428/209 |
| 5,366,814 A | * | 11/1994 | Yamanishi et al. | 428/607 |
| 5,800,930 A | * | 9/1998 | Chen et al. | 428/607 |
| 5,861,076 A | * | 1/1999 | Adlam et al. | 156/281 |
| 6,346,335 B1 | * | 2/2002 | Chen et al. | 428/629 |
| 6,372,113 B2 | * | 4/2002 | Yates et al. | 205/111 |
| 6,693,793 B2 | * | 2/2004 | Kuwako et al. | 361/323 |
| 6,989,199 B2 | * | 1/2006 | Yamamoto et al. | 428/607 |
| 7,691,487 B2 | * | 4/2010 | Nagatani | 428/607 |
| 8,512,873 B2 | * | 8/2013 | Fujisawa et al. | 428/607 |
| 2006/0088723 A1 | | 4/2006 | Suzuki | |
| 2007/0287020 A1 | | 12/2007 | Saito et al. | |
| 2011/0189499 A1 | | 8/2011 | Fujisawa et al. | |
| 2011/0189501 A1 | | 8/2011 | Fujisawa et al. | |

FOREIGN PATENT DOCUMENTS

| | | |
|---|---|---|
| JP | 11 256389 | 9/1999 |
| JP | 2000 269637 | 9/2000 |
| JP | 2005 344174 | 12/2005 |
| JP | 2006 103189 | 4/2006 |
| JP | 2006 142514 | 6/2006 |
| JP | 2007 238968 | 9/2007 |
| JP | 2007 332418 | 12/2007 |
| JP | 2008 285751 | 11/2008 |

OTHER PUBLICATIONS

International Search Report Issued Apr. 26, 2011 in PCT/JP11/51131 Filed Jan. 21, 2011.
Combined Office Action and Search Report issued Jun. 26, 2013 in Taiwanese Patent Application No. 100102464 with English language translation and English translation of categories of cited documents.

* cited by examiner

*Primary Examiner* — Cathy Lam
(74) *Attorney, Agent, or Firm* — Oblon, Spivak, McClelland, Maier & Neustadt, L.L.P.

(57) ABSTRACT

Provided is an industrially excellent surface-treated copper foil which satisfies requirements for adhesiveness to an insulating resin such as polyimide, heat-resistant adhesiveness, chemical resistance and soft etching properties. Also provided is a method for producing a surface-treated copper foil which achieves a high adhesion strength between an insulating resin and the copper foil, shows high chemical resistance in circuit formation and sustains good soft etching properties after forming vias by laser-processing. A base copper foil is subjected to a roughening treatment to give a surface roughness (Rz) of 1.1 μm or below. On the roughened surface, an Ni—Zn alloy layer is formed. The aforesaid roughening treatment is conducted in such a manner that the roughened surface comprises sharp-pointed convexes, which have a width of 0.3-0.8 μm, a height of 0.6-1.8 μm and an aspect ratio of 1.2-3.5, and the surface roughness (Rz) of said base copper foil is increased by 0.05-0.3 μm. The aforesaid Ni—Zn alloy layer has a Zn content of 6-30 wt % and a Zn deposition amount of 0.08 $mg/dm^2$ or more.

9 Claims, 2 Drawing Sheets

SURFACE-TREATED COPPER FOIL, METHOD FOR PRODUCING SAME, AND COPPER CLAD LAMINATED BOARD

TECHNICAL FIELD

The present invention relates to a copper foil and a method for producing the same and to a copper clad laminated board using a copper foil.

The present invention particularly relates to a surface-treated copper foil which is excellent in initial adhesion with an insulating resin, heat-resistant adhesion, and chemical resistance, has good circuit processability as well, and enables easily soft etching, and to a method for producing the same.

The present invention further relates to a copper clad laminated board (hereinafter sometimes also described as a CCL) using a surface-treated copper foil.

BACKGROUND ART

A CCL-use copper foil must be improved in adhesion strength when bonding the copper foil to an insulating resin and satisfy electrical characteristics required as a printed circuit board, etching properties, heat resistance, and chemical resistance. For this reason, various countermeasures have been applied, for example, the bonding surface of the copper foil after foil formation (hereinafter sometimes also referred to as "untreated copper foil") to be bonded to the insulating resin is roughened, the surface subjected to the roughening is further zinc (Zn) plated, nickel (Ni) plated, or the like, and further the surface subjected to the Zn plating or Ni plating or the like is chromate treated etc.

In IC (integrated circuit) mounting boards which drive liquid crystal displays used as display parts of personal computers, mobile phones, and PDAs (personal data assistants), recently there has been progress in increasing density. Accurate correct circuit configurations and heat stability at high temperature treatment are demanded in the manufacturing process of these.

In order to meet these demands, there is studied CCL in which an electrolytic copper foil for forming accurate conductive circuits and an insulating resin useable at a high temperature are adhered. One of the issues here is the improvement of the adhesion strength between the copper foil and the insulating resin at a high temperature for heat bonding of the copper foil and insulating resin at a high temperature of several hundred degrees. As a method for dealing with this issue, the art of roughening the untreated copper foil surface by a Zn-containing alloy is disclosed in, for example, Patent Literature (PLT) 1.

Further, as the method of adhering copper foil to an insulating resin, there is proposed a surface-treated copper foil obtained by treating the surface of an untreated copper foil to be adhered to an insulating resin by surface treatment by an electrolytic solution containing at least one type of element selected from among molybdenum, iron, cobalt, nickel, and tungsten and further providing an Ni plating layer or Zn plating layer or (Ni plating layer+Zn plating layer) on this plating layer (see, for example, PLT 2).

The roughened layers containing Zn layers disclosed in PLT's 1 and 2 are effective in the point of improving the adhesion strength between the copper foils and the insulating resins at high temperatures. However, after adhering the copper foils to the insulating resins, when wiring circuits are formed by etching by an acidic solution to obtain circuit boards, even the Zn layers adhering the copper foils and the insulating resins begin to dissolve since zinc is easily dissolved in acid, so the adhesion strength between the copper foil and insulating resin after the circuit formation sharply falls, resulting in the possibility of peeling off of the wiring circuits (copper foils) from the insulating resins during use of the circuit boards. In order to prevent this, dissolution and outflow of the Zn layer is kept to the lowest limit by shortening the etching time. However, an advanced technique and management system are needed for the etching, so the productivity of the circuit boards is lowered and costs are raised.

In this way, in actual circumstances, the roughenings disclosed in PLT's 1 and 2 do not satisfy all of the requirements of adhesion strength with the insulating resins, chemical resistance, and etching properties as described above, and therefore a surface-treated copper foil satisfying these characteristics has not yet been provided.

For this reason, a CCL satisfying all of the adhesion strength, chemical resistance, and etching properties has not yet been provided.

Further, for example, PLT 3 proposes a CCL formed by a surface-treated copper foil and a polyimide film obtained by applying, as the surface treatment of the copper foil, an Ni—Zn alloy plating by using a pyrophosphate bath as the plating bath. It is recognized that, by using the pyrophosphate bath, an Ni—Zn alloy layer excellent in uniformity of film thickness is obtained, and a phenomenon of tin (Sn) submerging into an interface between the circuit and the polyimide base material is hard to occur even when tin plating is carried out for the terminal parts after forming the circuit.

However, in plating using a pyrophosphate bath, as known, phosphorus (P) coprecipitates into the plating layer, so the solubility of the plating layer becomes high due to the coprecipitated P.

When the solubility of the plating layer becomes high, this greatly influences the process of circuit formation by etching. When Sn plating is carried out for the terminal parts in a circuit formed by etching copper foil, the submerging phenomenon of the Sn plating solution (deterioration of chemical resistance) cannot be sufficiently prevented, so the disadvantage arises that the surface-treated layer is deteriorated due to the Sn plating solution, and an adverse influence is exerted upon the adhesion of the wiring circuit.

In recent years, finer pitch of the circuit has been promoted and the width of the wiring circuit has becomes smaller, so the adhesion area between the circuit and the insulating resin is reduced. In such a fine pitch circuit, if submerging of the Sn plating solution occurs, the adhesion of the circuit falls and causes a disadvantage of reliability, therefore a copper foil capable of suppressing this submerging of the Sn plating solution has been demanded.

Here, an example of a process of forming an wiring pattern on a copper clad laminated board in which copper foils are provided on the two surfaces of a thin insulating resin such as a polyimide or the like (hereinafter, sometimes simply referred to as a "laminate board") by the subtractive method will be simply explained.

First, a photosensitive film (resist) is bonded to one copper foil surface (front surface side) of the laminate board. Using an exposure system which attaches an exposure mask to the photosensitive film surface, the pattern of the exposure mask is transferred (projected) onto the photosensitive film by application of exposure light. Unexposed portions in the photosensitive film are removed by a development process to form a resist pattern (etching resist).

Next, the copper foil in the portions which are not covered by the film resist pattern (exposed) is removed (etched) in an etching process to thereby form wirings on the front surface side. After that, in the etching process, the used film resist pattern is, for example, removed from the surface of the wirings (copper foil) by using an alkali aqueous solution.

Predetermined wirings are formed on the copper foil on the other surface (back surface side) as well by the same process as that described above.

As explained above, after forming wirings on the front and back surfaces, blind via holes for conductively connecting the front surface side wirings (copper foil) and the back surface side wirings (copper foil) are formed.

The blind via holes are formed by a laser beam drilling using $CO_2$ laser or other laser beam on the insulating resin exposed at the front surface side to form holes. In this process of forming holes by a laser, residue (smear) of the insulating resin remains at the bottoms of the holes (back surface side wirings). In order to remove this smear, there is used a potassium permanganate solution or other oxidizing chemicals to remove the smear (perform de-smearing).

Next, in order to conductively connect the front and back copper foils of the resin substrate, in the formed holes, a layer of copper (conductive layer) is formed by electroless plating or electrolytic plating. As the pre-treatment for this, the bottom portions of the holes (back surface side wirings) are treated by a hydrogen peroxide-based soft etchant to remove the surface treated metal of the copper foil. Finally, the bottom portions of the holes (back surface side wirings) subjected to the soft etching and the copper foil formed with holes (front surface side wirings) are conductively connected by electrolytic copper plating to thereby complete the wired substrate.

Note that, it is also possible to perform the process of forming wirings on the back surface side copper foil after forming the blind via holes.

CITATIONS LIST

Patent Literature

PLT 1: Japanese Patent Publication No. 2000-269637
PLT 2: Japanese Patent Publication No. 11-256389
PLT 3: Japanese Patent Publication No. 2005-344174

SUMMARY OF INVENTION

Technical Problem

However, in the process described above, when removal of smear is insufficient or a metal which is different from the plating ingredient remains in the bottom portions of the holes at the time of soft etching, the inconvenience sometimes arises that the conductive connection by the copper plating applied to the blind via holes becomes insufficient or the copper plating is not uniformly carried out.

Solution to Problem

An object of the present invention is to provide a surface-treated copper foil which is excellent in adhesion between a surface-treated copper foil and a polyimide or other insulating resin in an initial stage and after applying heat history (hereinafter, sometimes also referred to as "heat-resistant adhesion") and in chemical resistance, satisfies etching properties in the soft etching after forming blind via holes, and is industrially excellent.

Further, another object of the present invention is to provide a copper clad laminated board which is strong in adhesion strength between the surface-treated copper foil and insulating resin, particularly a polyimide, has chemical resistance in the circuit formation, and satisfies the soft etching properties.

The inventors intensively studied this and consequently found there was a problem between the back surface side copper foil and the conductive layer in the blind via holes formed by electroless plating and thereby completed the present invention.

The surface-treated copper foil of the present invention is characterized in that at least one surface of a base copper foil (untreated copper foil) is roughened to give a surface roughness Rz of 1.1 µm or less, an Ni—Zn alloy layer is applied to the roughened surface, and the roughening treatment is conducted in such a manner that the roughened surface comprises sharp-pointed convexes, which have a width of 0.3-0.8 µm, a height of 0.6-1.8 µm and an aspect ratio of 1.2-3.5, and the surface roughness (Rz) of said base copper foil is increased by 0.05-0.3 µm, the Ni—Zn alloy layer contains 6 to 30% of Zn in content (wt %) represented in Equation 1, and a Zn deposition amount is 0.08 mg/dm$^2$ or more.

Zn content (wt %)=Zn deposition amount/(Ni deposition amount+Zn deposition amount)×100     (1)

The method of production of a surface-treated copper foil of the present invention is a method of production of a surface-treated copper foil, comprising: roughening at least one surface of a base copper foil (untreated copper foil) by roughening giving a surface roughness Rz of 1.1 µm or less to form a roughened surface and providing an Ni—Zn alloy layer on the roughened surface, wherein the roughening treatment is conducted in such a manner that the roughened surface comprises sharp-pointed convexes, which have a width of 0.3-0.8 µm, a height of 0.6-1.8 µm and an aspect ratio of 1.2-3.5, and the surface roughness (Rz) of said base copper foil is increased by 0.05-0.3 µm, and the Ni—Zn alloy layer is formed in a layer that contains 6 to 30% of Zn in content (wt %) represented in Equation 1 and where the Zn deposition amount becomes 0.08 mg/dm$^2$ or more.

The copper clad laminated board of the present invention is formed by adhering the surface-treated copper foil to one surface or two surfaces of an insulating resin layer or adhering surface-treated copper foils produced by the method of production described above to each other.

Advantageous Effects of Invention

A surface-treated copper foil of the present invention is a surface-treated copper foil which satisfies adhesion with a polyimide or other insulating resin, heat-resistant adhesion, chemical resistance, and soft etching properties and is industrially excellent.

Further, according to the copper clad laminated board of the present invention, the adhesion strength between an insulating resin, particularly a polyimide, and the copper foil is strong, chemical resistance is provided in circuit formation, and the etching properties can be satisfied.

DESCRIPTION OF EMBODIMENTS

Figure 1:
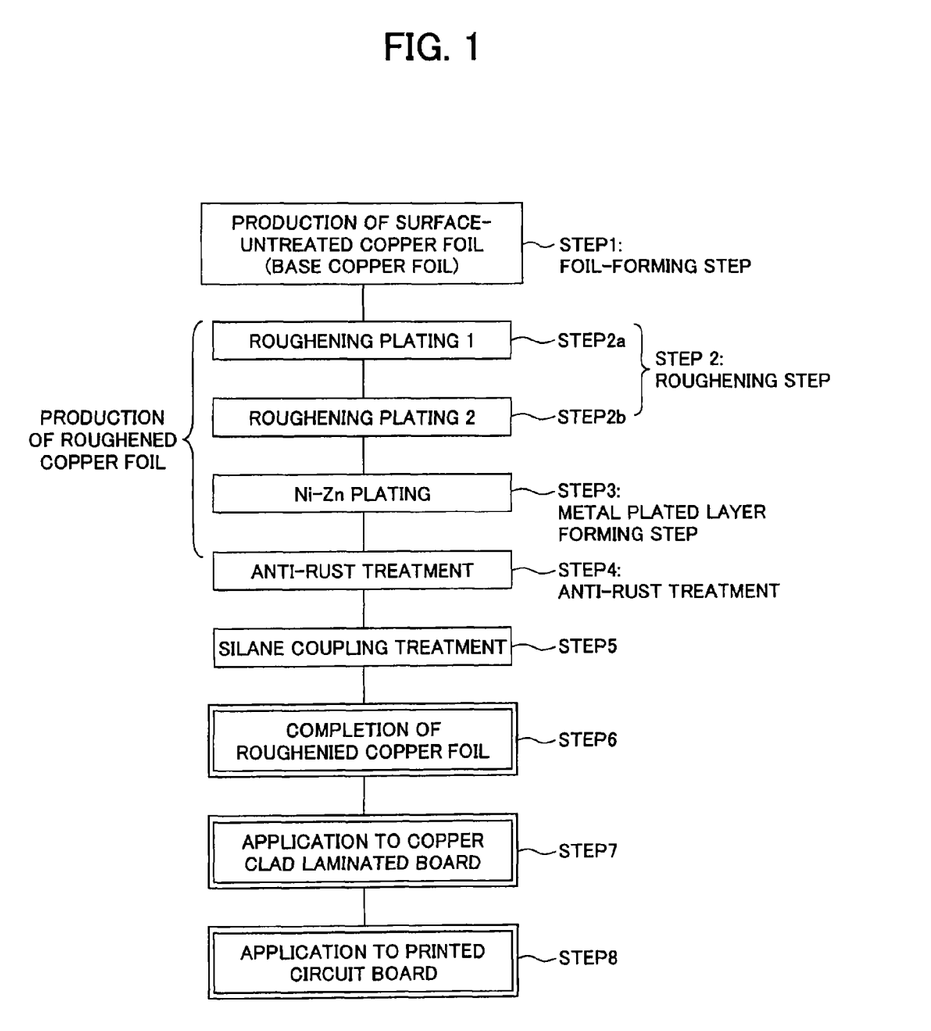
FIG. 1 A view illustrating a process of an embodiment of the present invention.

In an embodiment of the present invention, a base copper foil (untreated copper foil) to be surface treated is produced (FIG. 1, step 1). The base copper foil may be either of an electrolytic copper foil or rolled copper foil. Note that, when it is not necessary to particularly differentiate them, they will be sometimes expressed as "copper foil" or "base copper foil (untreated copper foil)".

The thickness of the untreated copper foil is preferably 5 μm to 35 μm. This is because, if the thickness of the copper foil is less than 5 μm, at the time of production, for example, wrinkles etc. will be formed and the production of thin copper foil will become costly, so this is not realistic. On the other hand, if the foil thickness is greater than 35 μm, the foil no longer meets the specifications for forming thinner and smaller IC mounting boards for driving liquid crystal displays of display parts of personal computers, mobile phones, and PDAs, so this is not preferred.

The surface of the base copper foil is treated by roughening (FIG. 1, steps 2 and 3) for improving the adhesion with the insulating resin (for example, polyimide) and anti-rust treatment (FIG. 1, step 4) aimed at rust-prevention on the top thereof.

In this embodiment of the present invention, as the surface treatment, roughening mainly by copper or copper alloy (step 2), roughening by an Ni—Zn alloy coating layer (step 3), and anti-rust treatment by Cr, Si, or the like (step 4) are applied.

In the roughening for improving the adhesion between the copper foil and a polyimide or other insulating resin, the adhesion is improved more as the roughening grains are made rougher, that is, the relief shapes of the surface are made rougher, but the etching properties in the soft etching tend to become worse.

In this embodiment of the present invention, as step 2, the surface of the base copper foil (untreated copper foil) is, first, roughened to increase the surface roughness Rz by 0.05 to 0.30 μm by copper or copper alloy and thereby prepare a surface-treated copper foil in which the Rz after roughening is made 1.1 μm or less.

Here, preferably roughening represented by a surface roughness Ra is carried out within a range where the Ra increases by 0.02 to 0.05 μm to make the Ra after the roughening 0.35 μm or less. If the surface roughness after the roughening is less than the above range, the adhesion with the insulating resin is degraded. On the other hand, if it exceeds the above range and the surface becomes rougher, the soft etching properties which will be explained later become poor.

In this embodiment of the present invention, the reason why the surface roughness Rz is particularly made 1.1 μm or less is that the soft etching properties which will be explained later are degraded if the surface roughness becomes rougher than this. That is, by making the surface roughness Rz after the roughening of the surface-treated copper foil 1.1 μm or less, a surface-treated copper foil which is excellent in adhesion with a polyimide and is excellent in soft etching properties can be obtained.

Note that, the surface roughnesses Ra and Rz are values measured according to the standards of JIS-B-0601.

Further, in this embodiment of the present invention, the roughened surface of the copper foil is comprised of projections forming the roughness of a size of 0.3 to 0.8 μm in width and 0.6 to 1.8 μm in height with pointed front ends. This is because, by forming such shapes, when adhering the foil to the insulating resin, the roughened surface relief easily cuts into the insulating resin (anchor effect), so a good adhesion can be obtained. Note that, in the size of the projections, the width is the length obtained by measuring the root portions at the foil surface, while the height is the length from the foil surface to the peaks.

Further, in this embodiment of the present invention, the aspect ratio=[height/width] of the projections at the roughened surface is made 1.2 to 3.5. The reason for making the aspect ratio=[height/width] 1.2 to 3.5 is that the adhesion with the insulating resin is not sufficient if the aspect ratio is less than 1.2, while a possibility of the roughened projections dropping off from the copper foil becomes high if the aspect ratio is larger than 3.5, so both are not preferred.

In this embodiment of the present invention, as step 3, on at least one surface of the roughened copper foil, an Ni—Zn alloy is deposited so that the Zn content (wt %) shown in the following Equation 1 becomes 6% to 30%, and the Zn deposition amount is 0.08 mg/dm² or more.

$$\text{Zn content (wt \%)} = \text{Zn deposition amount}/(\text{Ni deposition amount} + \text{Zn deposition amount}) \times 100 \quad (1)$$

The reason for restriction of the amount of deposition of Zn is improvement of the heat-resistant adhesion between the copper foil and the insulating resin and the chemical resistance of the copper foil. This is because the heat-resistant adhesion is not improved when the Zn content (wt %) in the Ni—Zn alloy is less than 6%, while the chemical resistance becomes bad when the content is larger than 30%, so both are not preferred.

Further, Zn is deposited at a amount of 0.08 mg/dm² or more. The reason for the deposition of Zn at a amount of 0.08 mg/dm² or more is the improvement of the heat-resistant adhesion. The effect of heat-resistant adhesion cannot be expected if the amount is less than 0.08 mg/dm².

In this embodiment of the present invention, the roughening is performed on a base copper foil (untreated copper foil) having a surface roughness Rz of 0.8 μm or less so that the Rz increases by 0.05 to 0.30 μm. Here, preferably, there is used a base copper foil having an Ra of 0.03 to 0.30 μm. Roughening that increases the Ra by 0.02 to 0.05 μm is preferably applied.

Here, the reason for restriction of the surface roughness is that the relief shapes (roughening) are not uniformly formed at the copper foil surface if the Rz of the base copper foil (untreated copper foil) exceeds 0.8 μm, and the reason for restriction of the range of the increased roughening is that an adverse influence is exerted upon the soft etching properties if the Rz is out of the range described above.

Figure 2:
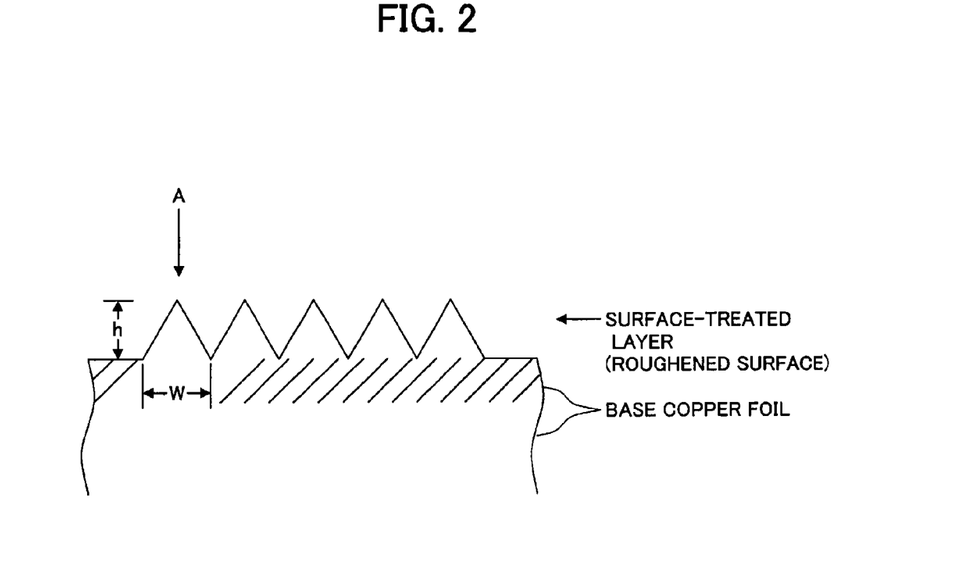
FIG. 2 A view showing an enlarged cross-section of a roughened copper foil according to an embodiment of the present invention.

Further, in this embodiment of the present invention, with respect to the two-dimensional surface area of the projections seen from A in FIG. 2, for example, preferably roughening whereby the three-dimensional surface area as observed by a laser microscope becomes 3 times or more greater is applied.

The reason for applying such roughening whereby the three-dimensional surface area observed by the laser microscope becomes 3 times or more greater than the two-dimensional surface area is that the area of contact of the soft etchant with the copper foil surface is small if the ratio is less than 3, so the etching speed becomes slow, and a drop in adhesion due to the reduction of contact area with the insulating resin occurs.

In this embodiment of the present invention, the roughening amount when applying roughening to the copper foil (weight of roughening particles deposited in the roughening) is preferably 3.56 to 8.91 g per 1 m² (equivalent thickness: 0.4 to 1.0 μm).

The reason for making the roughening amount 3.56 to 8.91 g per 1 m² is that the range becomes optimum for depositing roughening particles whereby the Rz increases by 0.05 to 0.30 μm or the Ra increases by 0.02 to 0.05 μm to the base copper foil (untreated copper foil).

In this embodiment of the present invention, as step 3, preferably an Ni—Zn alloy is deposited on at least one surface of the roughened copper foil so that the Ni deposition amount becomes 0.45 to 3 mg/dm². The reasons for restriction of the deposition amount of Ni are the improvement of the heat-resistant adhesion and the effect on the soft etching properties. That is, not that much improvement of the heat-resistant adhesion can be expected if the Ni deposition amount is less than 0.45 mg/dm², while there is liable to be an adverse influence exerted upon the soft etching properties if it is larger than 3 mg/dm².

In this embodiment of the present invention described above, controlling the shape of the roughening particles and the surface roughness and surface area thereof lead to an increase of the adhesion by the increase of surface area and anchor effect and the improvement of the heat-resistant adhesion. Further, after forming blind via holes by laser, the residue of resin in the roughened portions at the time of de-smearing of the bottom portions of the vias is reduced, the reduction of the amount of anti-rust metal per unit due to the increase of surface area and control with a narrow management range become possible, and the effect of enabling good soft etching properties is manifested.

The insulating resin used in the copper clad laminated board in this embodiment of the present invention is not particularly limited, but is preferably a polyimide from the viewpoints of the heat resistance and the dimensional stability. A polyimide forming a polyimide layer is generally represented by the following general formula (Chemical Formula 1) and can be produced by a known method in which use is made of substantially equimolar amounts of the diamine component and dianhydride component and they are polymerized in a polar organic solvent.

[Chemical Formula 1]

Formula (Chemical Formula 1)

Here, $Ar_1$ is a tetravalent organic group having 1 or more aromatic rings, and $Ar_2$ is a bivalent organic group having 1 or more aromatic rings. That is, $Ar_1$ is a residue of dianhydride, and $Ar_2$ is a residue of diamine.

As the dianhydride, for example, an aromatic tetracarboxylic dianhydride represented by $O(CO)_2$—$Ar_1$—$(CO)_2O$ is preferred. One giving the aromatic anhydride residue shown in the following Chemical Formula 2 as $Ar_1$ may be exemplified.

[Chemical Formula 2]

-continued

The dianhydride can be used alone or in a mixture of two or more types. Among them, preferably, use is made of one selected from among pyromellitic dianhydride (PMDA), 3,3', 4,4'-biphenyl tetracarboxylic dianhydride (BPDA), 3,3',4,4'-benzophenone tetracarboxylic dianhydride (BTDA), 3,3',4, 4'-diphenyl sulfone tetracarboxylic dianhydride (DSDA), and 4,4'-oxydiphthalic dianhydride (ODPA).

As the diamine, for example, an aromatic diamine represented by $H_2N$—$Ar_2$—$NH_2$ is preferred. An aromatic diamine giving the aromatic diamine residue shown in the following Chemical Formula 3 as $Ar_2$ may be exemplified.

[Chemical Formula 3]

Among these diamines, preferred exemplified ones are diaminodiphenylether (DAPE), 2'-methoxy-4,4'-diaminobenzanilide (MABA), 2,2'-dimethyl-4,4'-diaminobiphenyl (m-TB), paraphenylene diamine (P-PDA), 1,3-bis(4-aminophenoxy)benzene (TPE-R), 1,3-bis(3-aminophenoxy)benzene (APB), 1,4-bis(4-aminophenoxy)benzene (TPE-Q), and 2,2-bis[4-(4-aminophenoxy)phenyl]propane (BAPP).

As the solvent used for polymerization, for example, there can be mentioned dimethylacetamide, n-methylpyrrolidinone, 2-butanone, diglyme, xylene, etc. Among these, use can be made of one type or two or more types together. Further, the resin viscosity of the polyamide acid (polyimide precursor) obtained by polymerization is preferably within a range of 500 cps to 35000 cps.

The polyimide layer of the copper clad laminated board in the embodiment of the present invention may be configured by a single layer or a plurality of layers as well. However, in order to impart excellent dimensional stability of the flexible copper clad laminated board and the adhesion strength with the copper foil, configuration by a plurality of layers is preferred.

When the polyimide layer is configured by a plurality of layers, preferably a resin layer having a low linear expansion coefficient within a range of linear expansion coefficient (CTE) of $30 \times 10^{-6}$ [1/K] or less, preferably $1 \times 10^{-6}$ to $30 \times 10^{-6}$ [1/K], is formed as a main polyimide layer (1), and a polyimide layer (2) having a glass transition temperature of 330° C. or less is provided on one surface or two surfaces of that.

As the polyimide layer (2), preferably there is used a polymer having a linear expansion coefficient (CTE) exceeding $30 \times 10^{-6}$ [1/K] and having a glass transition temperature of not more than 330° C. More preferably, the polyimide layer (2) is one having a linear expansion coefficient of $30 \times 10^{-6}$ to $60 \times 10^{-6}$ [1/K] and having a glass transition temperature within a range of 200 to 330° C.

When the CTE of the polyimide layer (1) is larger than $30 \times 10^{-6}$ [1/K], curling when forming the copper clad laminated board is liable to becomes severe. Further, the dimensional stability falls, therefore the result is not preferred as a product. The thickness of the polyimide layer (1) is 50% or more, preferably 70 to 95%, of the thickness of all polyimide layers.

The thickness of the polyimide layer (2) is preferably within a range of 1.2 to 2.5 times the surface roughness (Rz) of the copper foil. If the value is smaller than 1.2 times the value of Rz, the fillability of the polyimide layer at the copper foil is insufficient, therefore good adhesion and reliability are not obtained. Further, if the value is larger than 2.5 times the value of Rz, cohesive failure in the polyimide layer occurs, and the adhesion falls, so this is not preferred.

The method of forming the polyimide layer is not particularly limited. However, preferably, for example, (a) a resin solution of a precursor of a polyimide, that is, a polyamide acid, is directly coated on the surface of the surface-treated copper foil, (b) a solvent contained in the resin solution is removed at a temperature not more than 150° C. to a certain extent, then, further, (c) heat treatment of about 5 to 40 minutes is carried out in a temperature range of 100 to 450° C., preferably 300 to 450° C., to thereby dry off the solvent and perform imidation.

When providing two or more polyimide layers, preferably, (aa) a first resin solution of a polyamide acid is coated and dried; then (bb) a second resin solution of a polyamide acid is coated and dried; (cc) below, in the same way, third and following resin solutions of a polyamide acid are sequentially coated and dried; then (dd) they are subjected to heat treatment for about 5 to 40 minutes within a temperature range of 300 to 450° C. together to thereby perform imidation.

If the temperature of heat treatment is lower than 100° C., the dehydration and ring closing reaction of the polyimide is not sufficiently advanced. Conversely, if it exceeds 450° C., the polyimide layer and copper foil are liable to deteriorate due to oxidation etc., so this is not preferred so much.

The thickness of the polyimide layer is desirably within a range of 6 to 60 μm, preferably within a range of 9 to 40 μm. If the thickness of the insulation layer is less than 6 μm, wrinkling at the time of conveyance in the production of copper clad laminated board etc. and other inconveniences are liable to occur. Conversely, if it exceeds 60 μm, problems in the dimensional stability, bendability, etc. at the time of production of the copper clad laminated board are liable to occur. Note that, when the polyimide layer is formed by a plurality of layers, the total thickness of the layers may be contained in the above range.

The copper clad laminated board in this embodiment of the present invention naturally may be a single-sided copper clad laminated board having a copper foil only on one surface side of the polyimide layer or may be a double-sided copper clad laminated board having copper foils on the two surfaces of the polyimide layer. Note that, in order to obtain a double-sided copper clad laminated board, single-sided copper clad laminated boards are formed, then made to face each other at their polyimide layers and press bonded by hot pressing, copper foil is hot press bonded to the polyimide layer of a single-sided copper clad laminated board, and so on.

The copper clad laminated board provided according to the embodiment of the present invention is excellent in adhesion between the copper foil and the polyimide layer and can be easily formed with vias by a $CO_2$ gas (carbon dioxide gas) laser or other laser. Therefore, even when etching, hole forming, de-smearing, soft etching, plating, and other processing are carried out, peeling and other problems do not occur, so high density mounting of electronic parts is possible.

In the copper clad laminated board provided according to this embodiment of the present invention, for example, from the polyimide surface, a $CO_2$ laser having an energy of 50 to 150 $mJ/cm^2$, preferably 100 to 120 $mJ/cm^2$, is directly irradiated to form blind via holes. Note that, the processing conditions such as the laser type described above and the irradiated energy amount are not limited to those explained above. The optimized conditions are suitably selected according to the resin thickness and resin type. Further, the method of forming holes in the copper clad laminated board and the method of removing the polyimide layer remaining in the bottom portions of the vias after forming the holes (de-smearing) and further the soft etching method for removing the antirust layer and roughened layer of the copper foil for achieving conduction by copper plating after that will be explained in the examples which will be explained later.

Note that, "blind via holes" are vias which open to only one side of the printed circuit board and are described in "Terminology of Printed Circuits" etc. edited by Japan Electronics Packing and Circuits Association.

EXAMPLES

Examples of the surface-treated copper foil of this embodiment of the present invention will be explained in detail next.
(1) Foil Formation Process: FIG. 1, Step 1

An untreated electrolytic copper foil was produced by the following plating bath and plating conditions.
(Plating Bath and Plating Conditions)
Copper sulfate: Copper concentration of 50 to 80 g/liter
Concentration of sulfuric acid: 30 to 70 g/liter
Concentration of chloride: 0.01 to 30 ppm
Solution temperature: 35 to 45° C.
Current density: 20 to 50 $A/dm^2$ (2) Roughening Process: FIG. 1, Step 2

By the following plating bath and electrolytic plating conditions, surface treatment was carried out in an order of roughening plating 1, then roughening plating 2, and roughening giving pointed projecting front ends was obtained.
(Roughening Plating 1: Step 2*a*)
Copper sulfate: Copper concentration of 5 to 10 $g/dm^3$
Concentration of sulfuric acid: 30 to 120 $g/dm^3$
Solution temperature: 20 to 60° C.
Current density: 10 to 60 $A/dm^2$
(Roughening Plating 2: Step 2*b*)
Copper sulfate: Copper concentration of 20 to 70 $g/dm^3$
Concentration of sulfuric acid: 30 to 120 $g/dm^3$
Solution temperature: 20 to 65° C.
Current density: 5 to 65 $A/dm^2$ (3) Ni—Zn Alloy Layer Forming Process: Step 3

Ni—Zn alloy plating was applied by the following plating bath and electrolytic plating conditions.
(Ni—Zn Alloy Plating Bath and Plating Conditions)
Nickel sulfate: Nickel concentration of 0.1 g/liter to 200 g/liter, preferably 20 g/liter to 60 g/liter
Zinc sulfate: Zinc concentration was 0.01 g/liter to 100 g/liter, preferably 0.05 g/liter to 50 g/liter
Ammonium sulfate: 0.1 g/liter to 100 g/liter, preferably 0.5 g/liter to 40 g/liter
Solution temperature: 20 to 60° C.
pH: 2 to 7
Current density: 0.3 to 10 $A/dm^2$ (4) Anti-Rust Treatment: Step 4
(Cr Plating)

After the Ni—Zn alloy plating, Cr treatment was applied to the surface of the alloy layer.

As the Cr treatment, use was made of chromic anhydride and the treatment was carried out in a bath giving a concentration of chromic anhydride of 0.1 g/liter to 100 g/liter while setting the solution temperature to 20 to 50° C. and the current density to 0.1 to 20 $A/dm^2$.

(5) Silane Treatment: Step 5

As the silane coupling treatment, use was made of γ-aminopropyltrimethoxysilane, a bath containing this in a concentration of 0.1 g/liter to 10 g/liter was prepared, and the treatment was carried out at a solution temperature of 20 to 50° C. by immersion or spraying or another method.

(6) Polyamide Layer (Polymerization of Polyamide Acid Resin)

Synthesis Example 1

A reactor vessel provided with a thermocouple and a stirrer and capable of introduction of nitrogen was charged with N,N-dimethylacetamide (DMAc). In this reactor vessel, 2,2-bis[4-(4-aminophenoxy)phenyl]propane (BAPP) was dissolved while stirring in the vessel. Next, pyromellitic dianhydride (PMDA) in equivalent mol to the diamine ingredient was added. After that, stirring was continued for about 3 hours to perform the polymerization reaction, whereby a resin solution of polyamide acid having a solid concentration of 15 wt % and solution viscosity of 3000 cps was obtained. A polyimide film was prepared by using the polyamide acid "a" and was measured for its glass transition temperature. As a result, it was 280° C., and the result of measurement of the linear expansion coefficient was $55 \times 10^{-6}$ [1/K].

Synthesis Example 2

A reactor vessel provided with a thermocouple and a stirrer and capable of introduction of nitrogen was charged with DMAc. In this reactor vessel, 2,2'-dimethyl-4,4'-diaminobiphenyl (m-TB) was dissolved while stirring in the vessel. Next, pyromellitic dianhydride (PMDA) in equivalent mol to the diamine ingredient was added. After that, stirring was continued for about 3 hours to perform the polymerization reaction, whereby a resin solution of polyamide acid "b" having a solid concentration of 15 wt %, and solution viscosity of 20000 cps was obtained. A polyimide film was prepared by using the polyamide acid "b" and was measured for its linear expansion coefficient. As a result, it was $13 \times 10^{-6}$ [1/K].

Preparation of Test Pieces

The above polyamide acid resin was applied to the produced untreated copper foils by the methods shown in the examples to obtain test pieces.

Measuring means, measurement conditions (1) Measurement of Deposition Amounts of Metal Analysis was carried out by fluorescent X-ray (ZSX Primus, made by Rigaku Corporation, analysis diameter: 35ϕ)

(2) Measurement of Surface Roughness

Measured by Surfcorder (SE1700 made by Kosaka Laboratory Ltd.)

(3) Calculation of Aspect Ratio

The width "w" and height "h" of projections shown in FIG. 2 of the roughened cross-section (processed by FIB or ultra-microtome) were measured by a scan type electron microscope (SEM) measuring the length of the root portion of the foil as the width "w" and the length from the root to the top of the foil as the height "h". The [height/width] was calculated as the aspect ratio.

(4) Calculation of Surface Area

The projections were measured by a laser microscope (VK8500 made by Keyence Corporation), and "surface area ratio=three-dimensional surface area/two-dimensional surface area" was calculated.

(5) Measurement of Initial Adhesion

This was found by using a Tensilon tester (made by Toyo Seiki Seisaku-Sho Ltd.), forming wirings having a width of 1 mm, fixing the resin side to a stainless steel plate by a double-sided tape, and peeling the copper wirings in a 90 degree direction at a rate of 50 mm/min. The judgment criteria (calculation method) is shown in Table 1.

(6) Measurement of Heat-Resistant Adhesion (Adhesion Strength After Heat Treatment)

The adhesion after heat treating the test pieces adhered to a polyimide at 150° C. for 168 hours was measured. As the judgment criteria of adhesion after the heat treatment, 90% or more of the initial adhesion was judged as passing.

Note that, the judgment criteria (calculation method) is shown in Table 1.

(7) Measurement of Chemical Resistance (Adhesion After Acid Treatment)

The test pieces after adhesion to polyimide were dipped in a hydrochloric acid solution of water:hydrochloric acid=1:1 at ordinary temperature for 1 hour, and the adhesion after that was measured. The judgment criteria (calculation method) is shown in Table 1.

(8) Soft Etching Properties

In the copper clad laminated boards prepared according to the method of preparation of evaluation specimen, blind via holes were prepared under the following conditions. After that, the shapes of the prepared via holes were observed by a 100× optical microscope to confirm the via shapes and states of penetration up to the bottom portions. After that, de-smearing was performed for the resin layers remaining in the bottom portions of the vias under the following conditions to remove the remaining resin layers and the surfaces of the copper foils were soft etched under the following conditions to remove the antirust layers and roughened layers and thereby expose the copper layers. It was confirmed by the SEM and EDX if the copper layers were exposed. The judgment criteria (calculation method) is shown in Table 1.

Formation of Blind Via Holes

Device: $CO_2$ gas laser machine (made by Shibuya Kogyo Co., Ltd.)

Via diameter: 400 μmϕ

Wavelength: 9.6 μm

Energy: About 115 J/cm²

De-Smearing

Swelling: Alkaline ethylene glycol solution (immersion time: 3 minutes)

Etching: Alkaline $KMnO_4$ aqueous solution (immersion time: 6 minutes)

Reduction: 2 wt % sulfuric acid aqueous solution (immersion time: 5 minutes)

Soft Etching

Chemical solution: CPE-920 (made by Mitsubishi Gas Chemical Company, Inc., diluted 10 fold with water)

Temperature: 25° C.

Treatment time: 60 s, 90 s

Example 1

To the surface of a base copper foil (untreated electrolytic copper foil) having surface roughnesses (Ra) of 0.08 μm and (Rz) of 0.58 μm, microroughening giving an increased amount of roughening after roughness formation of 0.03 μm in (Ra) and 0.15 μm in (Rz) was applied. The aspect ratio of roughening at this time was 1.4, and the surface area ratio was 3.7.

On this surface, a surface treated layer made by Ni—Zn alloy and chromate treated layer were formed, and a 3-aminopropyltrimethoxysilane treated layer was formed. The amount of nickel of the copper foil surface at that time was 0.91 mg/dm², and the amount of zinc was 0.17 mg/dm².

On this copper foil, a thermoplastic polyimide layer was formed by using the polyamide acid "a" produced in the above Synthesis Example 1 so that the thickness after hardening became 2 μm, a low thermal expansion resin layer was formed on that by using the polyamide acid "b" produced in the above Synthesis Example 2 so that the thickness after hardening become 21 μm, and further a polyimide layer was formed on that by using the above polyamide acid "a" so that the thickness after hardening became 2 μm to thereby obtain a flexible single-sided copper clad laminated board.

The initial adhesion of the obtained copper clad laminated board was 1.2 kN/m, and the heat-resistant adhesion after the elapse of 168 h at 150° C. was 1.1 kN/m. Further, the adhesion after the chemical resistance test was 1.2 kN/m.

The same copper foil as that described above was laminated to the resin surface of this copper clad laminated board to prepare a double-sided copper clad laminated board, a predetermined pattern was formed on the laminated copper foil surface, then the above lasering and following de-smearing and soft etching were performed for the opening portions. As a result, there was no remaining resin and residue of antirust metal and roughened portions in at the bottom portions of the vias, thus good via bottom portion characteristics were obtained.

These evaluation results are shown in Table 1.

Examples 2 to 9

To surfaces of base copper foils (untreated electrolytic copper foils) the same as that used in Example 1, microroughening was applied so that increased amounts of roughening shown in Table 1 were obtained. The aspect ratios and surface area ratios at this time are shown in Table 1.

On these surfaces, surface-treated layers made of Ni—Zn having deposition amounts shown in Table 1 and chromate-treated layers were formed, and silane-treated layers the same as that in Example 1 were formed.

On those copper foil surfaces, polyimide layers were formed by the same method as that for Example 1, then double-sided copper clad laminated boards were obtained.

The initial adhesion of the obtained copper clad laminated boards, their heat-resistant adhesion after the elapse of 168 h at 150° C., adhesion after the chemical resistance test, and the results of observation in the bottom portions of vias after soft etching are described in Table 1.

Example 10

To the surface of a base copper foil (untreated electrolytic copper foil) having surface roughnesses (Ra) of 0.20 μm and (Rz) of 0.85 μm, the microroughening was applied so that the increased amount of roughening shown in Table 1 was obtained. The aspect ratio and surface area ratio at this time are shown in Table 1.

On this surface, a surface-treated layer made of Ni—Zn having a deposition amount shown in Table 1 and a chromate treated layer were formed, and a silane-treated layer the same as that in Example 1 was formed.

On that copper foil surface, a polyimide layer was formed by the same method as that for Example 1, then a double-sided copper clad laminated board was obtained.

The initial adhesion of the obtained copper clad laminated board, its heat-resistant adhesion after the elapse of 168 h at 150° C., the adhesion after the chemical resistance test, and the results of observation in the bottom portions of vias after soft etching are described in Table 1.

Comparative Example 1

To the surface of a base copper foil (untreated electrolytic copper foil) the same as that used in Example 1, a chromate treated layer and silane treated layer the same as those in Example 1 were formed. On that copper foil surface, a polyimide layer was formed by the same method as that for Example 1, then a double-sided copper clad laminated board was formed. The initial adhesion of the obtained copper clad laminated board, its heat-resistant adhesion after the elapse of 168 h at 150° C., the adhesion after the chemical resistance test, and the results of observation in the bottom portions of vias after soft etching are described in Table 1.

Comparative Example 2

To the surface of a base copper foil (untreated electrolytic copper foil) the same as that used in Example 1, a surface-treated layer made of Ni—Zn having a deposition amount shown in Table 1 and a chromate-treated layer were formed, and a silane-treated layer the same as that in Example 1 was formed. On that copper foil surface, a polyimide layer was formed by the same method as that for Example 1, then a double-sided copper clad laminated board was formed. The initial adhesion of the obtained copper clad laminated board, its heat-resistant adhesion after the elapse of 168 h at 150° C., the adhesion after the chemical resistance test, and the results of observation in the bottom portions of vias after soft etching are described in Table 1.

Comparative Examples 3 to 7

To surfaces of base copper foils (untreated electrolytic copper foils) the same as that used in Example 1, microroughening was applied so that the increased amounts of roughening became as shown in Table 1. The aspect ratios and surface area ratios at this time are shown in Table 1. On these surfaces, surface-treated layers made of Ni—Zn having deposition amounts shown in Table 1 and chromate treated layers were formed, and silane treated layers the same as that in Example 1 were formed. On those copper foil surfaces, polyimide layers were formed by the same method as that for Example 1, then double-sided copper clad laminated boards were formed. The initial adhesion of the obtained copper clad laminated board, its heat-resistant adhesion after the elapse of 168 h at 150° C., the adhesion after the chemical resistance test, and the results of observation in the bottom portions of vias after soft etching are described in Table 1.

Comparative Example 8

To the surface of a base copper foil (untreated electrolytic copper foil) the same as that used in Example 10, microroughening was applied so that the increased amount of roughening became as shown in Table 1. The aspect ratio and surface area ratio at this time are shown in Table 1. On this surface, a surface-treated layer made of Ni—Zn having a deposition amount shown in Table 1 and a chromate treated layer were formed, and a silane treated layer the same as that in Example 1 was formed. On that copper foil surface, a polyimide layer was formed by the same method as that for Example 1, then a double-sided copper clad laminated board was formed. The initial adhesion of the obtained copper clad laminated board, its heat-resistant adhesion after the elapse of 168 h at 150° C., the adhesion after the chemical resistance test, and the results of observation in the bottom portions of vias after soft etching are described in Table 1.

TABLE 1

| No. | Alloy composition of copper foil surface Ni mg/dm² | Alloy composition of copper foil surface Zn mg/dm² | Zn amount % | Roughness of roughened foil Ra μm | Roughness of roughened foil Rz μm | Increased amount of roughening Ra μm | Increased amount of roughening Rz μm | Roughening width μm | Roughening height μm | Aspect ratio | Surface area ratio | Initial adhesion | Heat-resistant adhesion | Chemical resistance | Soft etching property | Overall judgment |
|---|---|---|---|---|---|---|---|---|---|---|---|---|---|---|---|---|
| Example 1 | 0.91 | 0.17 | 16 | 0.11 | 0.73 | 0.03 | 0.15 | 0.5 | 0.7 | 1.4 | 3.7 | Very good | Very good | Very good | Very good | Very good |
| Example 2 | 1.40 | 0.20 | 13 | 0.11 | 0.73 | 0.03 | 0.15 | 0.5 | 0.7 | 1.4 | 3.7 | Very good | Very good | Very good | Very good | Very good |
| Example 3 | 0.60 | 0.10 | 14 | 0.11 | 0.73 | 0.03 | 0.15 | 0.5 | 0.7 | 1.4 | 3.7 | Very good | Very good | Very good | Very good | Very good |
| Example 4 | 0.98 | 0.15 | 13 | 0.12 | 0.83 | 0.04 | 0.25 | 0.5 | 0.9 | 1.8 | 4.1 | Very good | Very good | Very good | Very good | Very good |
| Example 5 | 0.98 | 0.15 | 13 | 0.10 | 0.69 | 0.02 | 0.11 | 0.5 | 0.6 | 1.2 | 3.2 | Very good | Very good | Very good | Good | Good |
| Example 6 | 2.20 | 0.26 | 11 | 0.11 | 0.73 | 0.03 | 0.15 | 0.5 | 0.7 | 1.4 | 3.7 | Very good | Very good | Very good | Good | Good |
| Example 7 | 3.30 | 0.40 | 11 | 0.11 | 0.73 | 0.03 | 0.15 | 0.5 | 0.7 | 1.4 | 3.7 | Very good | Very good | Very good | Good | Good |
| Example 8 | 0.38 | 0.08 | 17 | 0.11 | 0.73 | 0.03 | 0.15 | 0.5 | 0.7 | 1.4 | 3.7 | Very good | Good | Very good | Very good | Good |
| Example 9 | 0.97 | 0.15 | 13 | 0.13 | 0.86 | 0.05 | 0.28 | 0.6 | 1.3 | 2.2 | 4.0 | Very good | Very good | Very good | Good | Good |
| Example 10 | 0.97 | 0.15 | 13 | 0.23 | 1.00 | 0.03 | 0.15 | 0.5 | 0.7 | 1.4 | 3.7 | Very good | Very good | Very good | Good | Good |
| Comp. Ex. 1 | No treatment | | | 0.08 | 0.58 | No roughening | | | | | 1.3 | Poor | Poor | Poor | Very good | Poor |
| Comp. Ex. 2 | 1.00 | 0.15 | 13 | 0.08 | 0.58 | No roughening | | | | | 1.3 | Good | Good | Good | Poor | Poor |
| Comp. Ex. 3 | 0.50 | 0.06 | 11 | 0.11 | 0.73 | 0.03 | 0.15 | 0.5 | 0.7 | 1.4 | 3.7 | Very good | Poor | Very good | Very good | Poor |
| Comp. Ex. 4 | 1.70 | 0.08 | 4 | 0.11 | 0.73 | 0.03 | 0.15 | 0.5 | 0.7 | 1.4 | 3.7 | Very good | Poor | Good | Good | Poor |
| Comp. Ex. 5 | 1.00 | 0.50 | 33 | 0.11 | 0.73 | 0.03 | 0.15 | 0.5 | 0.7 | 1.4 | 3.7 | Very good | Very good | Poor | Very good | Poor |
| Comp. Ex. 6 | 0.98 | 0.13 | 12 | 0.09 | 0.63 | 0.01 | 0.05 | 0.3 | 0.3 | 1.0 | 2.2 | good | Good | Very good | Poor | Poor |
| Comp. Ex. 7 | 1.00 | 0.13 | 12 | 0.15 | 0.92 | 0.07 | 0.34 | 0.9 | 1.9 | 2.1 | 4.2 | Very good | Very good | Very good | Poor | Poor |
| Comp. Ex. 8 | 1.00 | 0.13 | 12 | 0.38 | 1.40 | 0.04 | 0.25 | 0.5 | 0.9 | 1.8 | 4.0 | Very good | Very good | Very good | Poor | Poor |

In the evaluations, the judgment criteria shown in Table 1 were as follows. "Very good": excellent, "Good": within standard, and "Poor": out of standard.

The judgment criteria in the evaluation items were as follows.

Initial Adhesion (kN/m)

"Very good": 1.0 or more, "Good": 0.8 or more, but less than 1.0, and "Poor": less than 0.8

Heat-resistant adhesion [adhesion after heat resistance test (kN/m)]

"Very good": 0.9 or more, "Good": 0.72 or more, but less than 0.9, "Poor": less than 0.72

Chemical resistance [adhesion after chemical resistance test (kN/m)]

"Very good": 1.0 or more, "Good": 0.8 or more, but less than 1.0, "Poor": less than 0.8

Soft Etching Property (Results of Observation at Bottom Portions of Vias After Soft Etching)

"Very good": Removed by treatment time of 60 s, "Good": removed by treatment time of 90 s, and "Poor": impossible to remove by treatment time of 90 s As shown in Table 1, in Example 1 to Example 4, the alloy compositions, roughnesses of roughened foils, increased amounts of roughening, aspect ratios, and surface areas are within the ranges, therefore the evaluation items are within good ranges. (Comprehensive evaluation: Very good)

In Example 5, the aspect ratio and surface area ratio are within the standard, but are 1.2 and 3.2 or small, therefore the soft etching property is a bit low. (Comprehensive evaluation: Good)

In Example 6, the Ni deposition amount is within the standard, but is 2.20 mg/dm², that is, a bit larger, therefore a long time is taken for the soft etching, so the soft etching property is a bit low. (Comprehensive evaluation: Good)

In Example 7, the Ni deposition amount is 3.30 mg/dm² or larger than that in Example 6, therefore a slightly longer time is taken for the soft etching than in Example 6. (Comprehensive evaluation: Good)

In Example 8, the Ni deposition amount is 0.38 mg/dm², that is, small, therefore the heat-resistant adhesion is slightly low. (Comprehensive evaluation: Good)

In Example 9, the increased amount of roughening and aspect ratio are within the ranges, but Rz=0.28 μm and aspect ratio=2.2, that is, large, therefore the soft etching property is slightly inferior. (Comprehensive evaluation: Good)

In Example 10, the surface roughnesses of the base copper foil (untreated electrolytic copper foil) are Rz 1.00 μm and Ra=0.23 μm, that is, large, therefore the soft etching property is slightly inferior. (Comprehensive evaluation: Good)

In Comparative Example 1, the roughening is not carried out, and an Ni—Zn alloy layer is not provided, therefore the soft etching property is good, but the other evaluation items are out of the standard. (Comprehensive evaluation: Poor)

In Comparative Example 2, the Ni—Zn alloy layer is provided, but the roughening is not carried out, therefore the soft etching property is out of the standard. (Comprehensive evaluation: Poor)

In Comparative Example 3, the Zn deposition amount is less than 0.08 mg/dm$^2$, therefore the heat-resistant adhesion is out of the standard. (Comprehensive evaluation: Poor)

In Comparative Example 4, the Zn content is lower than the standard, therefore the heat-resistant adhesion is out of the standard. (Comprehensive evaluation: Poor)

In Comparative Example 5, the Zn content is over the standard, therefore the chemical resistance is out of the standard. (Comprehensive evaluation: Poor)

In Comparative Example 6, the increased amount of roughening is small, and the roughening width, roughening height, and aspect ratio are small as well, therefore the soft etching property is out of the standard. (Comprehensive evaluation: Poor)

In Comparative Example 7, the increased amount of roughening, roughening width, and roughening height are over the standard, so the soft etching property is out of the standard. (Comprehensive evaluation: Poor)

In Comparative Example 8, the roughness of the roughened foil is over the standard, therefore the soft etching property is out of the standard. (Comprehensive evaluation: Poor)

As explained above, the surface-treated copper foil based on the embodiment of the present invention is the surface-treated copper foil which satisfies the initial adhesion with polyimide, heat-resistant adhesion, chemical resistance, and soft etching properties and is industrially excellent.

Further, according to the method of production of the surface-treated copper foil of the present invention, surface-treated copper foil which is excellent in adhesion with polyimide and industrially satisfies the chemical resistance and soft etching properties can be produced.

Further, according to the copper clad laminated board based on the embodiment of the present invention, excellent effects are exhibited, for example, the adhesion strength between an insulating resin, particularly a polyimide, and the copper foil is strong, an acid resistance is provided at the time of circuit formation, and the etching properties are satisfied.

The invention claimed is:

1. A surface-treated copper foil,
   wherein at least one surface of the surface-treated copper foil is obtained by a process comprising roughening an untreated base copper foil, thereby obtaining a roughened surface having a surface roughness Rz of 1.1 μm or less, and applying an Ni—Zn alloy layer to the roughened surface,
   the roughened surface comprises sharp-pointed convexes, which have a width of from 0.3 to 0.8 μm, a height of from 0.6 to 1.8 μm, and an aspect ratio of from 1.2 to 2.2,
   the roughening increases the surface roughness by from 0.05 to 0.3 μm,
   the Ni—Zn alloy layer has a content of from 6 to 30% of Zn by weight, as calculated by:

Zn content (wt %)=Zn deposition amount/(Ni deposition amount+Zn deposition amount)×100 wherein
   a Zn deposition amount is from 0.08 to 1.28 mg/dm$^2$,
   a Ni deposition amount is from 0.45 to 3 mg/dm$^2$, and
   a ratio of a three-dimensional surface area relative to a two-dimensional surface area of the roughened surface is 3 times or more.

2. The surface-treated copper foil of claim 1, wherein a surface roughness Ra of the untreated base copper foil is 0.3 μm or less, and the Rz is 0.8 μm or less.

3. A copper clad laminated board, obtained by a process comprising:
   adhering the surface-treated copper foil of claim 1 to a surface of an insulating resin layer.

4. The copper clad laminated board of claim 3, wherein the insulating resin layer comprises a polyimide.

5. A method of producing the surface-treated copper foil of claim 1, the method comprising:
   roughening a surface of an untreated base copper foil, thereby obtaining a roughened surface having a surface roughness Rz of 1.1 μm or less and
   providing an Ni—Zn alloy layer on the roughened surface,
   wherein the roughening increases the surface roughness Rz of the base copper foil by from 0.05 to 0.3 μm,
   the roughened surface comprises projecting relief shapes of a width at the roughened surface of from 0.3 to 0.8 μm, a height of from 0.6 to 1.8 μm, an aspect ratio [height/width] of from 1.2 to 2.2, and pointed front ends,
   the Ni—Zn alloy layer has a content of from 6 to 30% of Zn by weight, as calculated by:

Zn content (wt %)=Zn deposition amount/(Ni deposition amount+Zn deposition amount)×100  (1), wherein a Zn deposition amount is from 0.08 to 1.28 mg/dm$^2$, and
   a Ni deposition amount is from 0.45 to 3 mg/dm$^2$.

6. The method of claim 5, comprising roughening the surface of the untreated base copper foil with roughening particles, wherein a weight of deposition of the roughening particles in the roughening is from 3.56 to 8.91 g/m$^2$, and an equivalent thickness of the roughening particles is from 0.4 to 1.0 μm.

7. The method of claim 5, further comprising:
   applying an anti-rust treatment to the Ni—Zn alloy layer, thereby obtaining a layer subjected to the anti-rust treatment.

8. The method of claim 7, further comprising:
   applying a silane coupling treatment on the layer subjected to the anti-rust treatment.

9. A copper clad laminated board, obtained by a process comprising:
   adhering two surface-treated copper foils produced by the method of claim 5 to each other via the Ni—Zn alloy layers applied to the roughened surface of each copper foil.

* * * * *